(12) United States Patent
Ueda et al.

(10) Patent No.: US 10,194,519 B1
(45) Date of Patent: Jan. 29, 2019

(54) CHIP MOUNTER, ELECTRONIC CIRCUIT SUBSTRATE, AND POWER MODULE

(71) Applicant: Mitsubishi Electric Corporation, Tokyo (JP)

(72) Inventors: Tetsuya Ueda, Tokyo (JP); Takahiko Anan, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/966,003

(22) Filed: Apr. 30, 2018

(30) Foreign Application Priority Data

Jul. 27, 2017 (JP) ................................. 2017-145291

(51) Int. Cl.
*H05K 1/16* (2006.01)
*H05K 1/02* (2006.01)
*H05K 7/18* (2006.01)

(52) U.S. Cl.
CPC ............... *H05K 1/02* (2013.01); *H05K 1/16* (2013.01); *H05K 7/183* (2013.01); *H05K 2201/10681* (2013.01); *H05K 2203/082* (2013.01); *H05K 2203/088* (2013.01)

(58) Field of Classification Search
USPC .................................. 361/748, 679.01, 720
See application file for complete search history.

(56) References Cited

U.S. PATENT DOCUMENTS 9,190,573 B2 * 11/2015 Barchmann ............... H05K 1/02
2017/0251578 A1 * 8/2017 Takata ............... H05K 13/0417

FOREIGN PATENT DOCUMENTS

| JP | 2003-298298 A | 10/2003 |
| JP | 2008-103405 A | 5/2008 |
| JP | 2010-109109 A | 5/2010 |

* cited by examiner

*Primary Examiner* — Andargie M Aychillhum
(74) *Attorney, Agent, or Firm* — Studebaker & Brackett PC

(57) ABSTRACT

Provided is a chip mounter, an electronic circuit substrate, and a power module, where the chip mounter prevents foreign substances from a chip-mounter installation environment, dust generated from members, and dust generated from the chip mounter, thereby preventing failures caused by the foreign substances. The chip mounter takes out a chip component accommodated in a packing tape. The packing tape has a pocket. The pocket has a bottom surface provided with a through hole. The chip mounter includes a tape travelling rail, a sucking-and-mounting arm, and a cavity cleaning mechanism. The cavity cleaning mechanism includes an intake hole disposed upstream of a suction point, in a location of the tape travelling rail, on which the carrier tape with a cover tape attached thereto travels so as to overlap the through hole. The cavity cleaning mechanism takes in the inside of the pocket through the intake hole and the through hole.

29 Claims, 12 Drawing Sheets

CHIP MOUNTER, ELECTRONIC CIRCUIT SUBSTRATE, AND POWER MODULE

BACKGROUND OF THE INVENTION

Field of the Invention

The present invention relates to chip mounters, electronic circuit substrates, and power modules.

Description of the Background Art

A known chip mounter is configured such that chip components are taken out from a packing tape and then mounted on a substrate (c.f., Japanese Patent Application Laid-Open No. 2010-109109). The packing tape consists of a carrier tape and a cover tape. The carrier tape has a plurality of pockets accommodating the chip components and arranged in a longer-side direction of the carrier tape. The cover tape is joined to the openings of the pockets of the carrier tape.

The packing tape is set in a chip mounter while being wound around a reel called a tape reel. In the chip mounter, the chip components are taken out from the pockets of the carrier tape after the cover tape is detached from the packing tape. The chip components are taken out by a sucking arm having a sucking head at its tip. The chip components are transferred to a substrate that is previously set and then mounted on the substrate by the sucking arm.

In a conventional chip mounter, some foreign substances floating in a space where the chip mounter operates can be mounted on the substrate along with the chip components. In addition, other foreign substances generated from the chip components can be mounted on the substrate along with the chip components. In addition, still other foreign substances accommodated in the pockets of the packing tape can be mounted on the substrate along with the chip components. Such foreign substances mounted on the substrate along with the chip components unfortunately cause a poor appearance and poor electrical properties of an electronic circuit substrate as manufactured.

SUMMARY

It is an object of the present invention to provide a chip mounter, an electronic circuit substrate, and a power module, where the chip mounter prevents foreign substances from a chip-mounter installation environment, dust generated from members, and dust generated from the chip mounter, thereby preventing failures caused by the foreign substances.

The chip mounter according to an aspect of the present invention is configured to take out a chip component accommodated in a packing tape and mount the chip component onto a substrate. The packing tape includes a carrier tape having a plurality of pockets individually accommodating a plurality of the chip components, and a cover tape covering individual openings of the plurality of pockets. The plurality of pockets each have a bottom surface provided with a through hole. The chip mounter includes the following: a tape travelling rail on which the packing tape to be fed to a suction point travels; a sucking-and-mounting arm configured to, at the suction point, take out the chip component from the pocket of the carrier tape with the cover tape detached therefrom by sucking the chip component; and a cavity cleaning mechanism. The cavity cleaning mechanism includes an intake hole disposed upstream of the suction point, in a location of the tape travelling rail, on which the carrier tape with the cover tape attached thereto travels so as to overlap the through hole. The cavity cleaning mechanism is configured to take in the inside of the pocket through the intake hole and the through hole.

These and other objects, features, aspects and advantages of the present invention will become more apparent from the following detailed description of the present invention when taken in conjunction with the accompanying drawings.

DESCRIPTION OF THE PREFERRED EMBODIMENTS

<Fundamental Technique>

Figure 11:
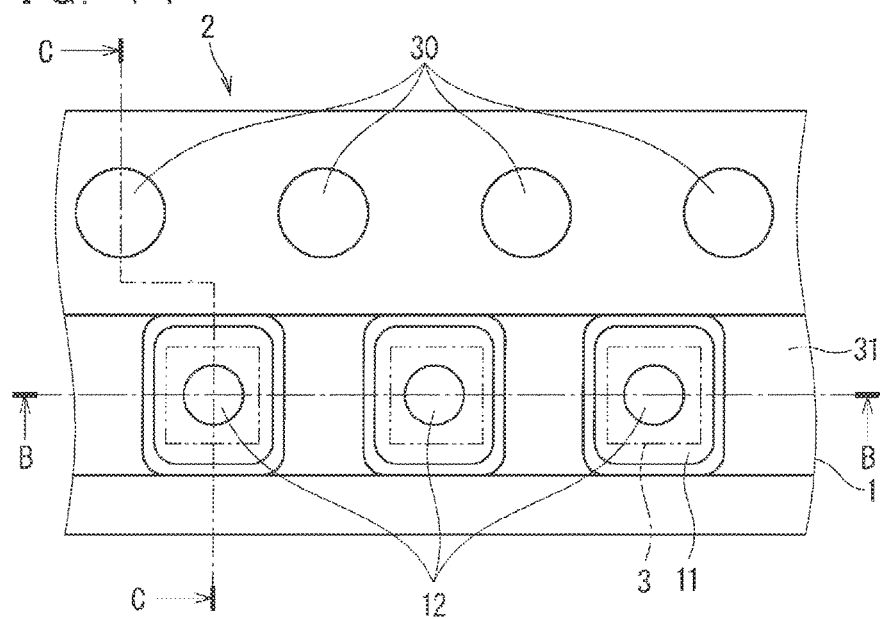
FIG. 11 is a plan view of a packing tape.
Figure 12:
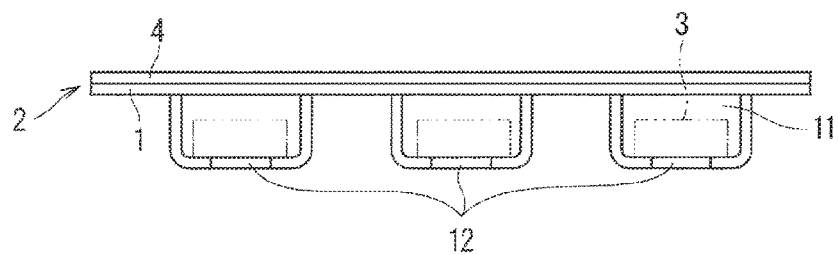
FIG. 12 is a cross-sectional view taken along line B-B in FIG. 11.
Figure 13:
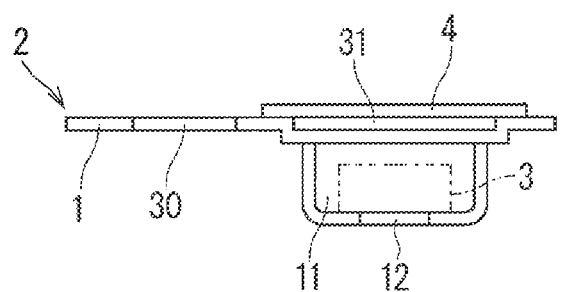
FIG. 13 is a cross-sectional view taken along line C-C in FIG. 11.

The following describes a technique that is fundamental to the present invention before the description of the preferred embodiments of the present invention. FIG. 11 is a plan view of a packing tape 2. FIG. 12 is a cross-sectional view of the packing tape 2 taken along line B-B in FIG. 11; that is, FIG. 12 is a cross-sectional view of the packing tape 2 in a longer-side direction of the packing tape 2. FIG. 13 is a cross-sectional view of the packing tape 2 taken along line C-C in FIG. 11; that is, FIG. 13 is a cross-sectional view of the packing tape 2 in a shorter-side direction of the packing tape 2. For simple illustration, FIG. 11 does not show a cover tape 4.

The packing tape 2 includes a carrier tape 1 and the cover tape 4. As illustrated in FIGS. 12 and 13, the carrier tape 1 has hollows, which herein are pockets 11, arranged in a longer-side direction of the carrier tape 1 at regular intervals, the pockets 11 individually accommodating chip components 3. For reference, FIGS. 11 to 13 show each chip component 3 indicated by chain double-dashed lines.

The carrier tape 1 has a plurality of feeding holes 30 arranged on one side or both sides of the tape, the feeding holes 30 each being used to feed the tape. FIG. 11 shows the feeding holes 30 arranged on one side of the tape.

Each pocket 11 of the carrier tape 1 has a bottom surface provided with a through hole 12. The through hole 12 is used to inspect the presence or absence of the chip component 3 within the pocket 11.

The carrier tape 1 has recesses 31 in the longer-side direction of the carrier tape 1 between the pockets 11 adjacent to each other and around the pockets 11. These recesses 31 are used to adjust a joining strength between the carrier tape 1 and the cover tape 4. The cover tape 4, if joined between the adjacent pockets 11 and around the pockets 11, has a large joining area. This reduces the detachability of the cover tape 4 when the cover tape 4 is detached from the carrier tape 1. The reduction in detachability produces oscillations during the detachment of the cover tape 4 from the carrier tape 1. Consequently, the chip components 3 can go out of the pockets 11.

The cover tape 4 is disposed over the individual pockets 11 of the carrier tape 1 after the chip components 3 are disposed in the individual pockets 11. The cover tape 4 is heated at this stage to be joined or fused to the carrier tape 1.

The packing tape 2, having the chip components 3 accommodated in the individual pockets 11, is wound around a reel, which herein is a tape reel 5 illustrated in FIG. 14 (detailed in later on), and is then set in a chip mounter.

Figure 14:
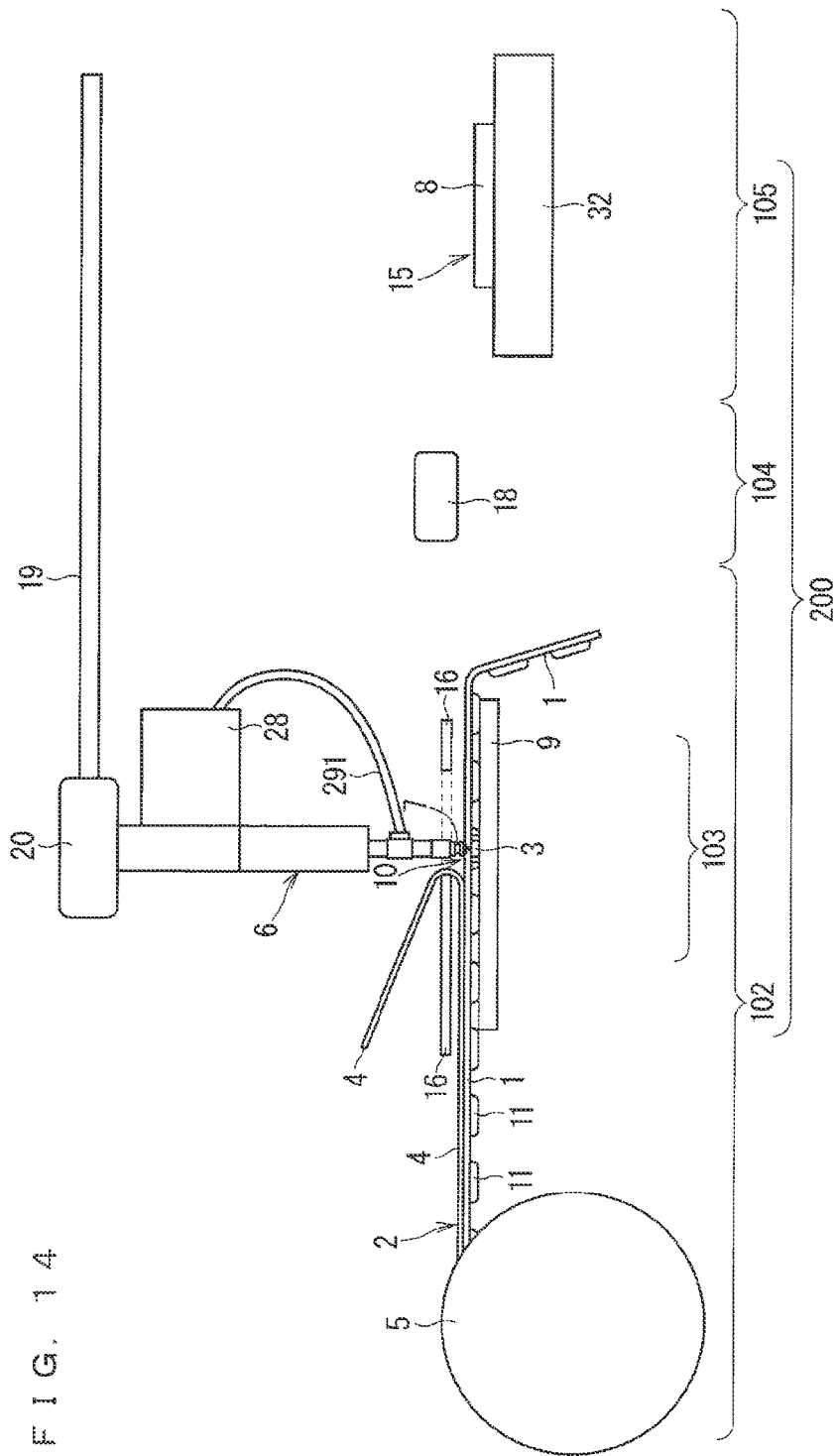
FIG. 14 is a schematic view of a configuration of a chip mounter according to a fundamental technique with a sucking-and-mounting arm located at a suction point.
Figure 15:
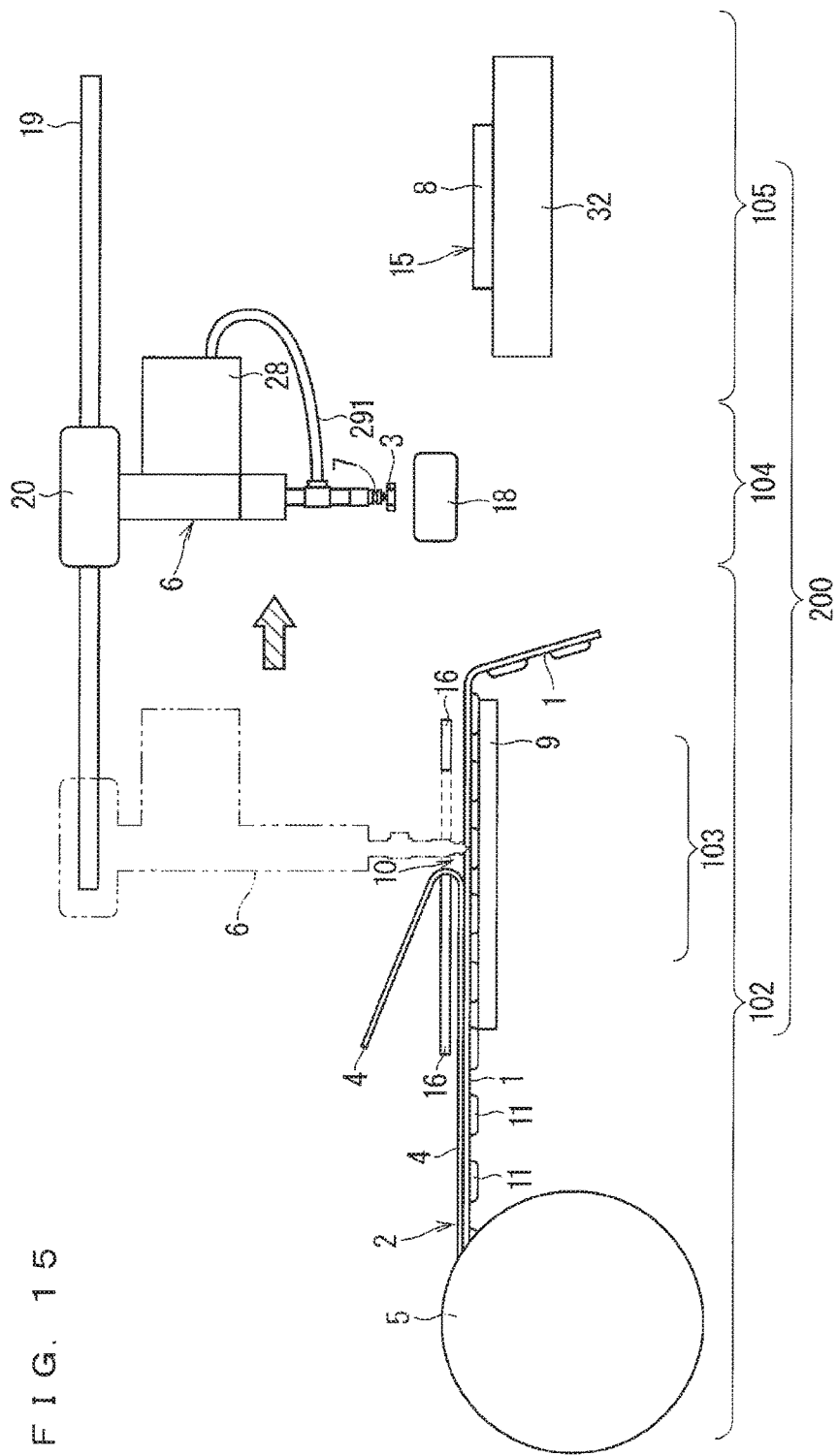
FIG. 15 is a schematic view of a configuration of a chip mounter according to the fundamental technique with a sucking-and-mounting arm located in an inspection section.
Figure 16:
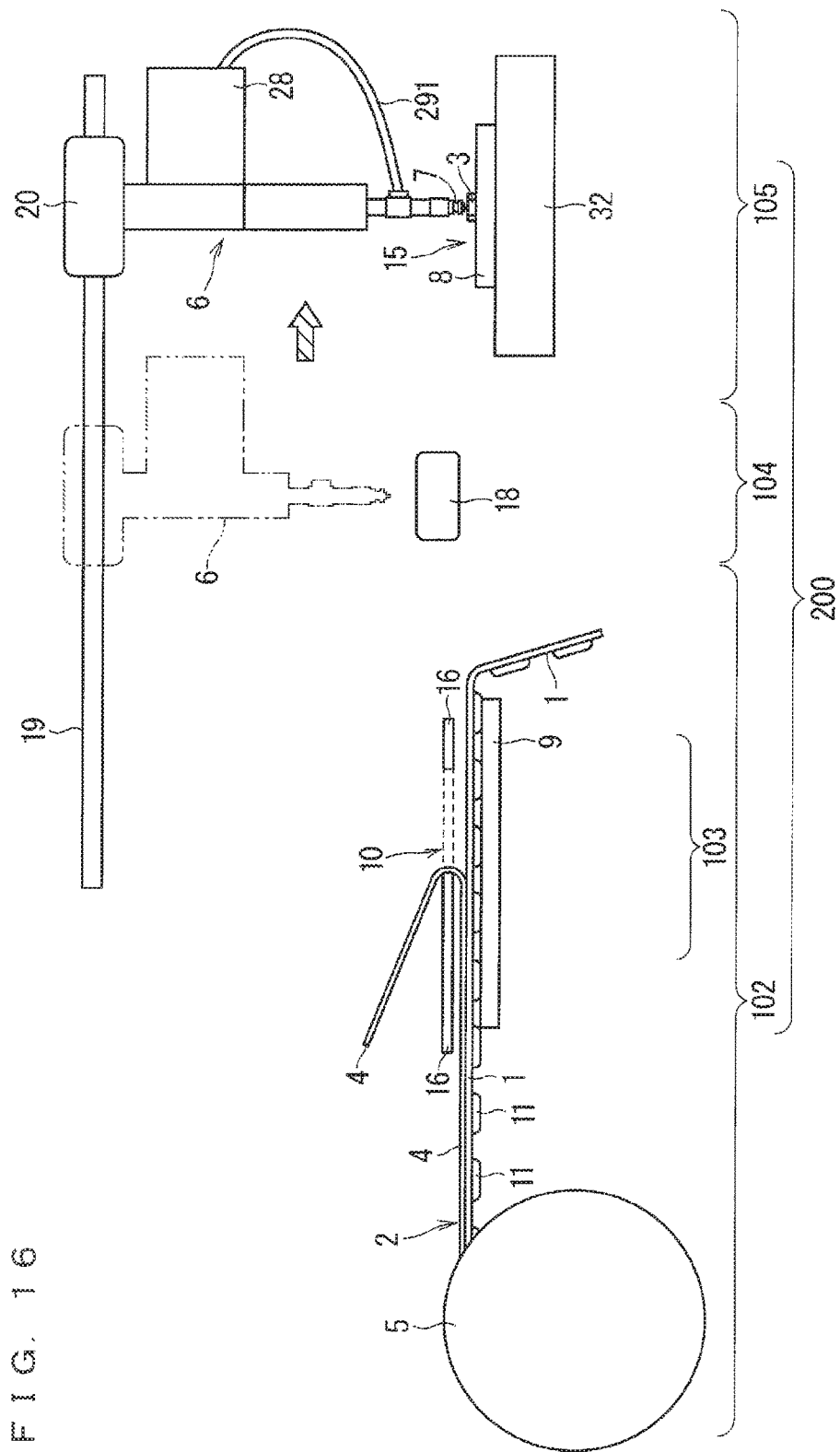
FIG. 16 is a schematic view of a configuration of the chip mounter according to the fundamental technique with the sucking-and-mounting arm located at a mount point.

FIGS. 14 to 16 are schematic views of a configuration of a chip mounter 200 in the fundamental technique. FIG. 14 illustrates a sucking-and-mounting arm 6 located at a suction point 10. FIG. 15 illustrates the sucking-and-mounting arm 6 located in an inspection section 104. FIG. 16 illustrates the sucking-and-mounting arm 6 located in a mount point 15. It is noted that the sucking-and-mounting arm 6 is fixed, in its upper part, to a driver 20 having a drive mechanism, and is movable in accordance with the movement of the driver 20 along a rail 19.

The chip mounter 200 in the fundamental technique includes a feeder section 102, an inspection section 104, and a mount section 105. The feeder section 102 has a section in which a sucking head 7 of the sucking-and-mounting arm 6 sucks each chip component 3; this section is referred to as a suction section 103.

The feeder section 102 includes the tape reel 5. The feeder section 102 feeds the packing tape 2 by rolling the tape reel 5. The suction section 103 supplies chip components 3 to the suction point 10. The suction section 103 includes a tape travelling rail 9 and the sucking-and-mounting arm 6. The packing tape 2 to be fed to the suction point 10 travels on the tape travelling rail 9.

The packing tape 2 moves on the tape travelling rail 9 while being sandwiched between a top tape guide 16 and the tape travelling rail 9. The top tape guide 16 sandwiches the packing tape 2 from above the tape travelling rail 9, and avoids a suck failure resulting from the disconnection of the carrier tape 1 when each chip component 3 is sucked. The top tape guide 16 partly has an opening; the cover tape 4 is detached from the carrier tape top 1 in this opening. Accordingly, the chip components 3 are exposed from the pockets 11. The cover tape 4 as detached from the carrier tape 1 is wound by a reel, which is not shown.

As illustrated in FIG. 14, the sucking-and-mounting arm 6 takes out the chip components 3 from the pocket 11 of the carrier tape 1 with the cover tape 4 detached therefrom by sucking the chip component 3. The sucking head 7 is mounted on the tip of the sucking-and-mounting arm 6. The sucking head 7 is flexible and has a suction-cup shape. The sucking head 7 in a low pressure sucks the chip component 3. The sucking-and-mounting arm 6 elongates and shortens during the sucking, transferring, and mounting to raise and lower the height of the sucking head 7 in conformance with the suction point 10 and the mount point 15.

The sucking head 7 is operated by an intake-and-exhaust mechanism 28 that is attached to the sucking-and-mounting arm 6. To be specific, in the sucking of the chip component 3, the intake-and-exhaust mechanism 28 takes in air to reduce the pressure of the sucking head 7. In the mounting of the chip component 3 in the mount section 105, the intake-and-exhaust mechanism 28 exhausts air to increase the pressure of the sucking head 7. The intake-and-exhaust mechanism 28 is connected to the sucking-and-mounting arm 6 via an air tube 291.

The inspection section 104 is disposed between the suction point 10 and the mount point 15. The inspection section 104 includes an optical inspection unit 18. As illustrated in FIG. 15, the optical inspection unit 18 inspects a position where the chip component 3 is sucked with an image, and then calculates a relative position between the sucking head 7 and the chip component 3. The inspection section 104 then corrects a positional deviation of the chip component 3 with respect to the mount point 15 on a substrate 8. To be specific, for a deviation of the relative position between the sucking head 7 and the chip component 3, calculated by the optical inspection unit 18, from a reference position, the inspection section 104 corrects this deviation to control the operation of the driver 20 or the operation of the sucking-and-mounting arm 6 so that the chip component 3 is mounted on the mount point 15. The reference position herein means a relative position between the sucking head 7 and the chip component 3, the relative position being enough for the chip component 3 to be mounted on the mount point 15. That is, the inspection section 104 corrects no deviation when the relative position between the sucking head 7 and the chip component 3 is equal to the reference position.

The mount section 105 includes a mount stage 32. The substrate 8 is disposed on the mount stage 32. The substrate 8 is moved onto and out of the mount stage 32 by an in-loader and an out-loader, which are not shown. The substrate 8 has a land. The land has a circuit pattern disposed on a surface of the substrate 8, the circuit pattern being coated with a joining material, such as a solder paste and a conductive resin paste. As illustrated in FIG. 16, the sucking-and-mounting arm 6 mounts the chip component 3 onto the land on the substrate 8 of the mount stage 32. At this time, the sucking-and-mounting arm 6 mounts the chip component 3 in such a manner that the land on the substrate 8 is positioned in conformity with a terminal (not shown) of the chip component 3.

In the chip mounter 200 according to the fundamental technique, some foreign substances floating in a space where the chip mounter 200 operates can be mounted on the substrate 8 along with the chip components 3. In addition, other foreign substances generated from the chip components 3 can be mounted on the substrate 8 along with the chip components 3. In addition, still other foreign substances accommodated in the pockets 11 of the packing tape 2 can be mounted on the substrate 8 along with the chip components 3. Such substrate mounting of theses foreign substances along with the chip components 3 unfortunately causes a poor appearance and poor electrical properties of an electronic circuit substrate to be manufactured.

Recent miniaturization of the chip components 3 involves a small interval between the terminals of the chip components 3. Some tiny foreign substances can exist between the terminals of the chip components 3 accommodated in the packing tape 2. The tiny foreign substances, if mounted on the substrate 8 along with the chip components 3, reduce the insulation properties between the terminals, thereby affecting the electrical properties and reliability of an electronic circuit substrate as manufactured. Further, a solder ingredient can extend along the tiny foreign substances when the land of the substrate 8 is soldered with the terminals of the chip components 3. This reduces a necessary insulation distance between the terminals, thereby reducing the insulation properties of the electronic circuit substrate as manufactured. Each preferred embodiment of the present invention solves these problems.

First Preferred Embodiment

Figure 1:
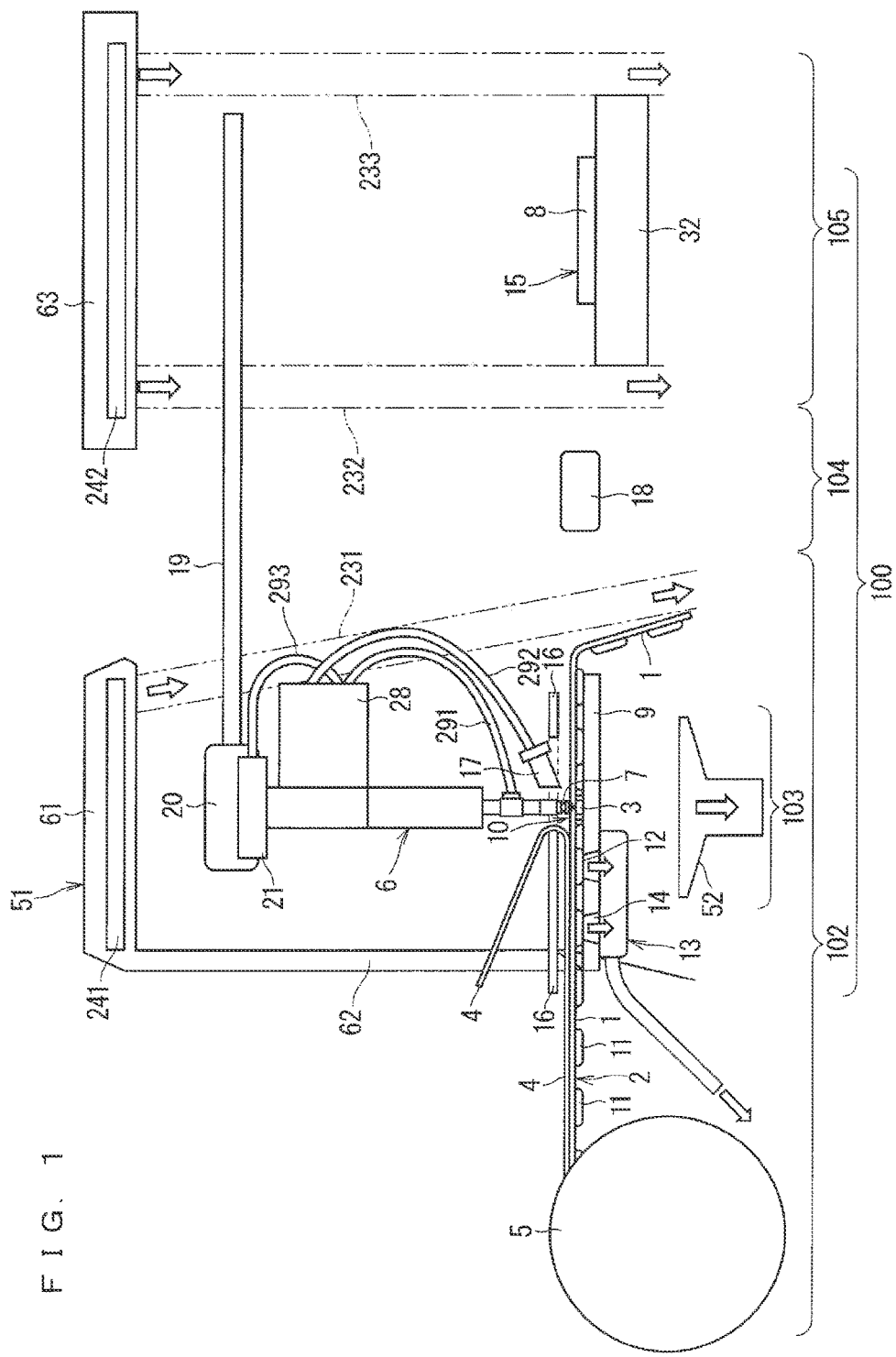
FIG. 1 is a schematic view of a configuration of a chip mounter according to a first preferred embodiment with a sucking-and-mounting arm located at a suction point.
Figure 2:
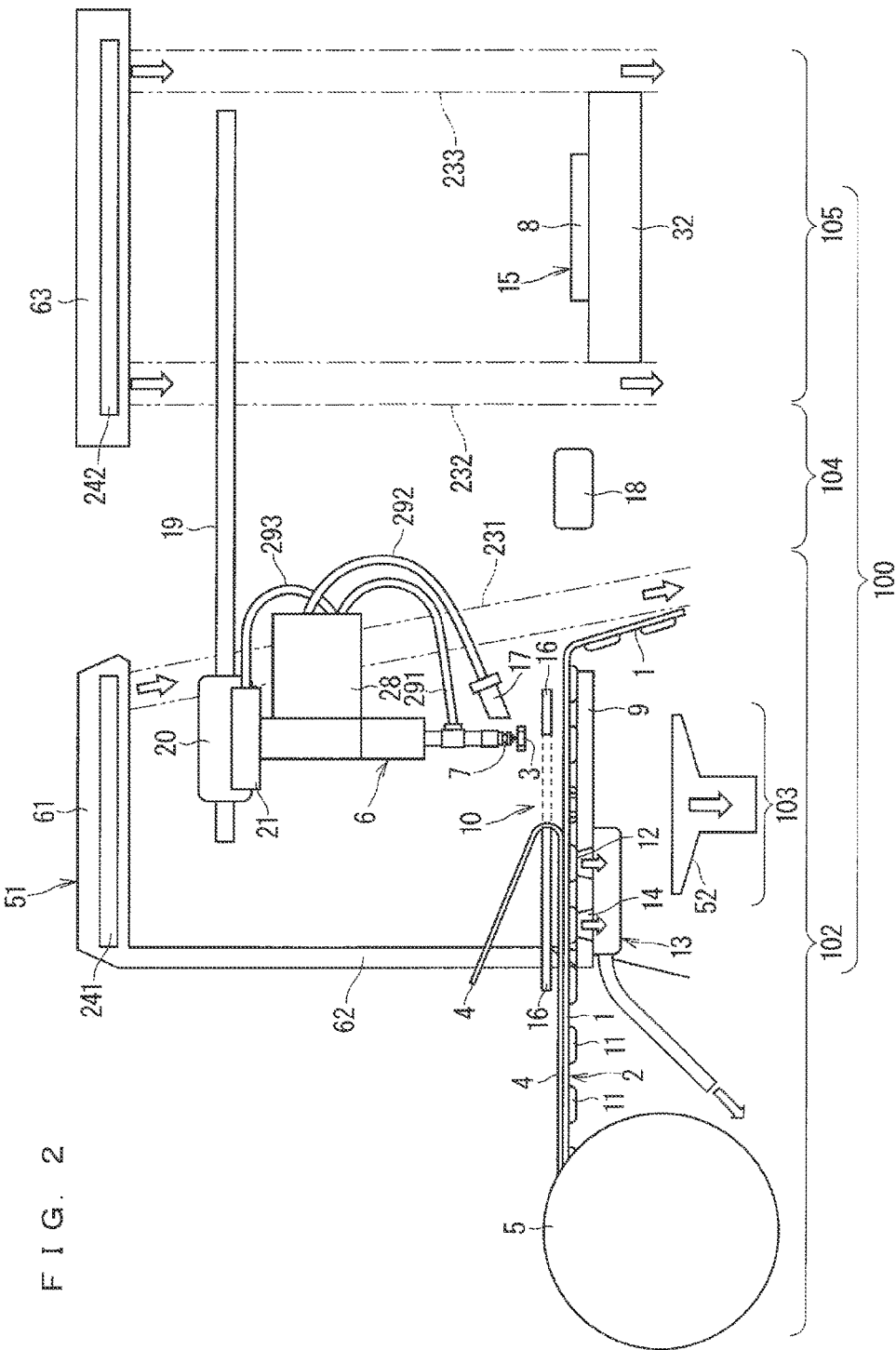
FIG. 2 is a schematic view of the configuration of the chip mounter according to the first preferred embodiment with the sucking-and-mounting arm being in the middle of its movement from the suction point to an inspection section.
Figure 3:
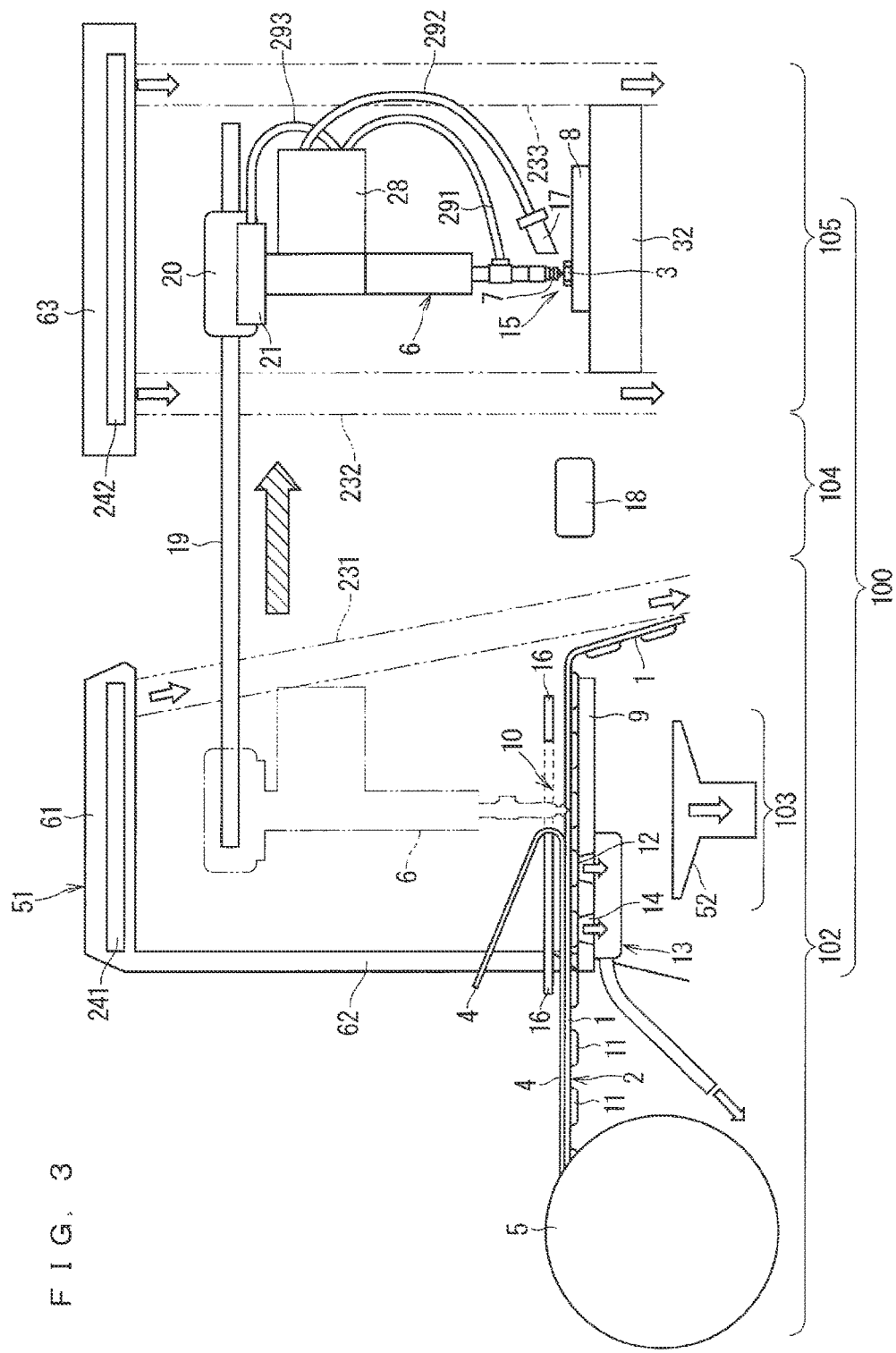
FIG. 3 is a schematic view of the configuration of the chip mounter according to the first preferred embodiment with the sucking-and-mounting arm located at the suction point.

FIGS. 1 to 3 are schematic views of a configuration of a chip mounter 100 according to a first preferred embodiment. FIG. 1 illustrates a sucking-and-mounting arm 6 located at a suction point 10. FIG. 2 illustrates the sucking-and-mounting arm 6 in the middle of its movement from the suction point 10 to an inspection section 104. FIG. 3 illustrates the sucking-and-mounting arm 6 located at a mount point 15.

The chip mounter 100 according to the first preferred embodiment includes a feeder section 102, the inspection section 104, and a mount section 105. The feeder section 102 has a section in which a sucking head 7 of the sucking-and-mounting arm 6 sucks each chip component 3; this section is referred to as a suction section 103.

Figure 4:
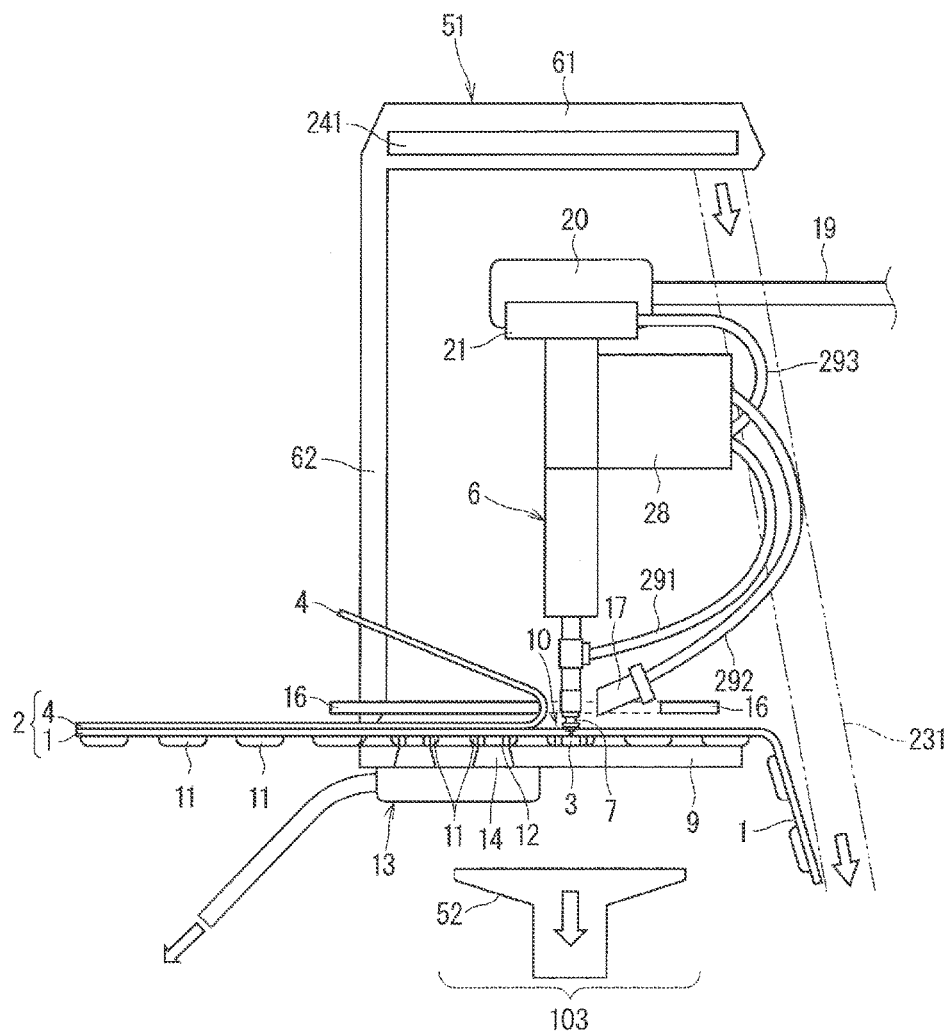
FIG. 4 is a schematic view of a configuration of a suction section of the chip mounter according to the first preferred embodiment.

FIG. 4 is a schematic view of a configuration of the suction section 103 of the chip mounter 100. The chip mounter 100 further includes a cavity cleaning mechanism 13 disposed in the suction section 103 as well as the above components, which are the same as those of the chip mounter 200 in the fundamental technique.

Figure 5:
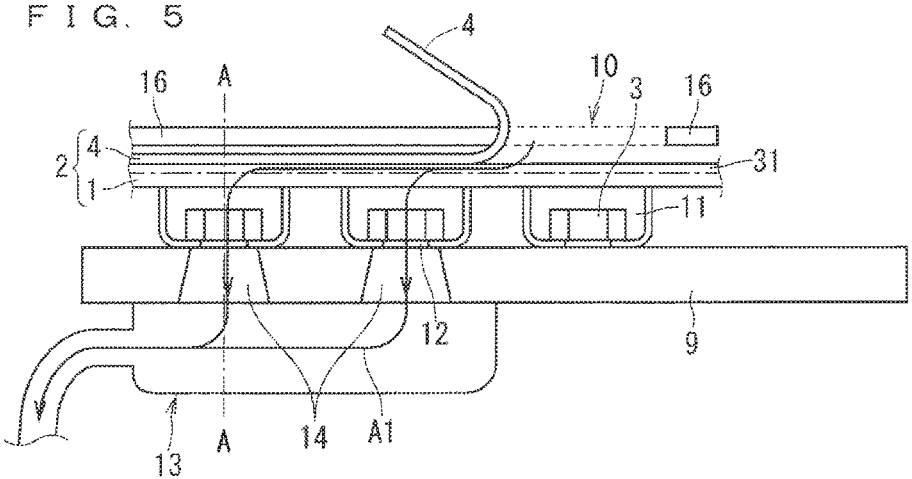
FIG. 5 is a schematic view of a configuration of a cavity cleaning mechanism of the chip mounter according to the first preferred embodiment.

FIG. 5 is a schematic view of a configuration of the cavity cleaning mechanism 13. The cavity cleaning mechanism 13 includes intake holes 14. The intake holes 14 each penetrate a tape travelling rail 9. The intake holes 14 are disposed upstream of the suction point 10, in a location of the tape travelling rail 9, on which a carrier tape 1 with a cover tape 4 attached thereto travels so as to overlap through holes 12 disposed on the bottom surfaces of pockets 11. In the drawing, an arrow A1 indicates the flow of air taken in by the cavity cleaning mechanism 13. As indicated by the arrow A1, the air taken in by the cavity cleaning mechanism 13 is introduced from a location where the carrier tape 1 is detached from the cover tape 4, the location being near the suction point 10; the air then passes through a recess 31 between the carrier tape 1 and the cover tape 4, and is then exhausted outside the chip mounter 100 sequentially through the inside of the pocket 11, the through hole 12, and the intake hole 14.

Figure 6:
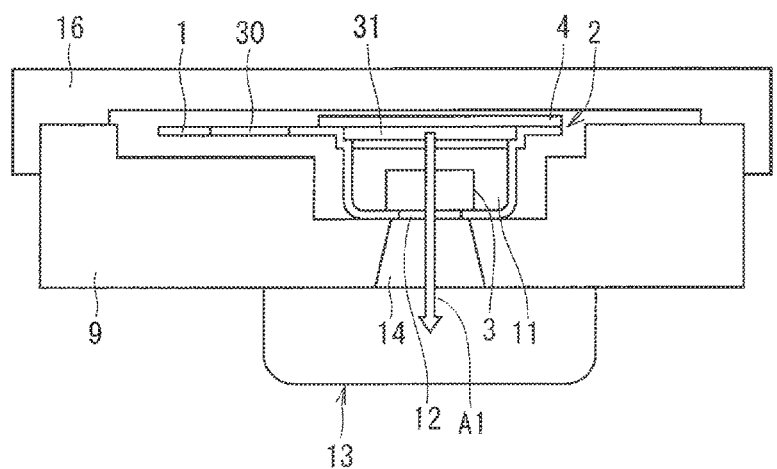
FIG. 6 is a cross-sectional view taken along line A-A in FIG. 5.

FIG. 6 is a cross-sectional view taken along line A-A in FIG. 5. In the first preferred embodiment, a top tape guide 16 is disposed above the through hole 12 of the tape travelling rail 9. The top tape guide 16 is engaged in the tape travelling rail top 9 on the left and right sides of a packing tape 2. The engagement between the tape travelling rail 9 and the top tape guide 16, as illustrated in FIG. 6, produces a contact surface between the tape travelling rail 9 and the top tape guide 16; the contact surface has an artificial seal shape. This prevents air from a gap between the tape travelling rail 9 and the top tape guide 16 from entering. Consequently, the cavity cleaning mechanism 13 efficiently sucks the inside of the pocket 11 of the packing tape 2, as seen from the flow of air indicated by the arrow A1. As a result, the cavity cleaning mechanism 13 efficiently removes a foreign substance (e.g., a burr resulting from carrier tape cut, an environmental foreign substance resulting from carrier tape packing, or other substances) within the pocket 11 of the packing tape 2.

Figure 7:
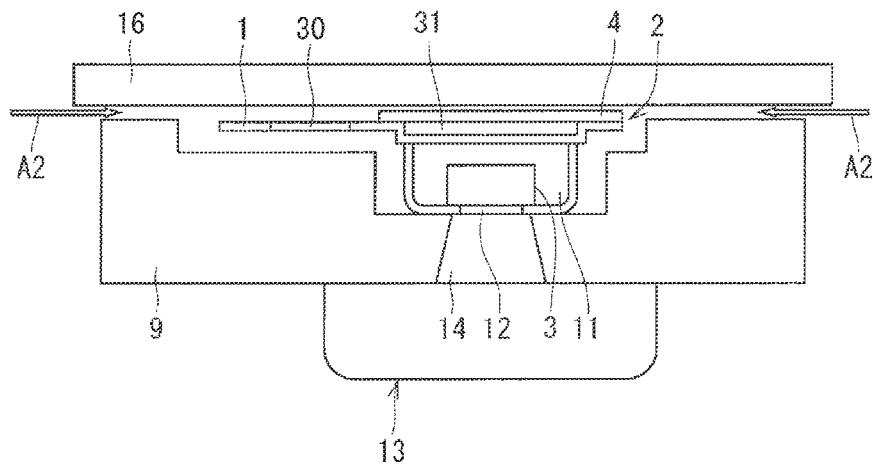
FIG. 7 is a diagram illustrating a comparison with the cross-sectional view of FIG. 6.

FIG. 7 is a diagram illustrating a comparison with the cross-sectional view of FIG. 6. In FIG. 7, the top tape guide 16 is a plate. If the top tape guide 16 is a plate and is not engaged in the tape travelling rail 9, air enters from a gap between the tape travelling rail 9 and the top tape guide 16, as indicated by an arrow A2. This lowers the efficiency of intake within the pocket 11 of the packing tape 2, thereby reducing the effect of foreign substrate removal.

The following describes an operation timing of the cavity cleaning mechanism 13. The packing tape 2 is fed to the suction point 10 in a unit of the pocket 11 while repeating a movement and a stop. The cavity cleaning mechanism 13 takes in the inside of the pocket 11 after the packing tape 2 stops moving and the sucking-and-mounting arm 6 takes out the chip component 3 from the pocket 11, and until the packing tape 2 starts moving. That is, the cavity cleaning mechanism 13 takes in the inside of the pocket 11 of the packing tape 2 after the packing tape 2 stops moving and the sucking-and-mounting arm 6 takes out the chip component 3.

As illustrated in FIG. 1, the chip mounter 100 in the first preferred embodiment further includes a foreign-substance removing head 17 as well as the same components as those of the chip mounter 200 in the fundamental technique. The foreign-substance removing head 17 sprays a gas to the chip component 3 as taken out from the packing tape 2 and sucked by the sucking head 7 of the sucking-and-mounting arm 6.

As illustrated in FIG. 2, the foreign-substance removing head 17 sprays the gas to the chip component 3 when the chip component 3 is sucked and moved from the suction point 10 to the inspection section 104, which will be described later on, by the sucking head 7 of the sucking-and-mounting arm 6. That is, the foreign-substance removing head 17 sprays the gas before the inspection section 104 detects a positional deviation.

Figure 8:
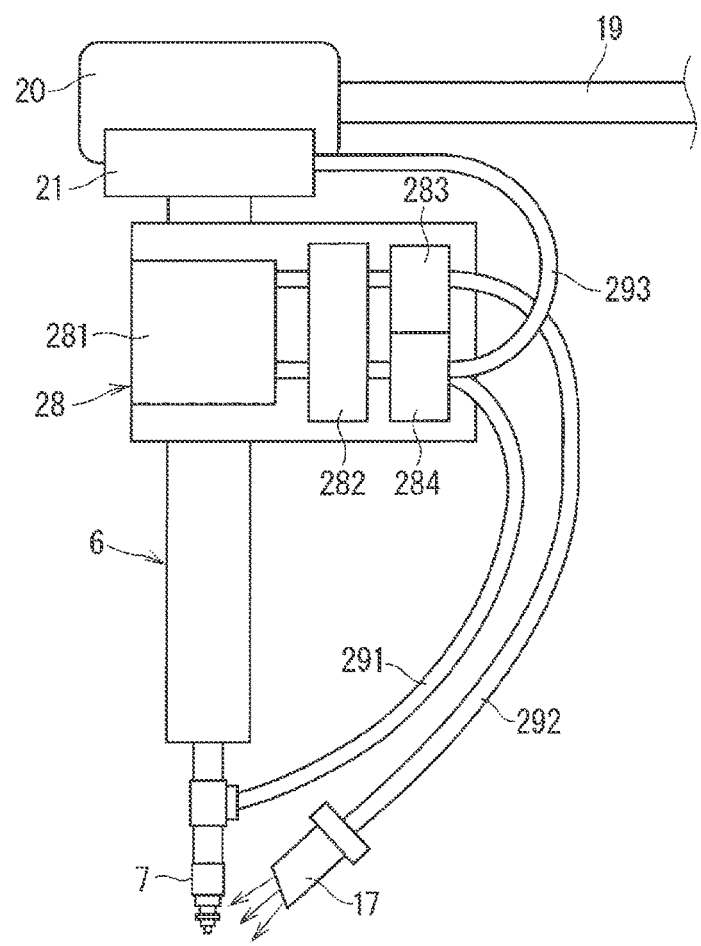
FIG. 8 is a schematic view of a configuration of an intake-and-exhaust mechanism attached to the sucking-and-mounting arm of the chip mounter according to the first preferred embodiment.

FIG. 8 is a schematic view of a configuration of the intake-and-exhaust mechanism 28 attached to the sucking-and-mounting arm 6. The suction performed by the sucking head 7 of the sucking-and-mounting arm 6 and the gas spray performed by the foreign-substance removing head 17 are, in common, performed by the intake-and-exhaust mechanism 28. The intake-and-exhaust mechanism 28 includes an intake-and-exhaust pump 281 and an intake-and-exhaust regulating valve 282. The intake-and-exhaust regulating valve 282 has an intake part connected to the sucking head 7 via a filter 284 and an air tube 291. The filter 284 herein is a filter through which the foreign substance is removed. The intake-and-exhaust regulating valve 282 has an exhaust part connected to the foreign-substance removing head 17 via a filter 283 and an air tube 292. The filter 283 herein is a filter through which an oil mist is removed.

As illustrated in FIG. 1, the chip mounter 100 in the first preferred embodiment further includes a driver-dust collecting mechanism 21 as well as the same components as those of the chip mounter 200 in the fundamental technique. The driver-dust collecting mechanism 21 collects dust generated by friction between a drive mechanism of the driver 20 and the rail 19 while the driver 20 is moving along the rail 19.

As illustrated in FIG. 8, the suction performed by the sucking head 7 of the sucking-and-mounting arm 6 and the intake performed by the driver-dust collecting mechanism 21 are performed by the intake-and-exhaust mechanism 28 in common. The intake part of the intake-and-exhaust regulating valve 282 is connected to the sucking head 7 via the air tube 291, and also to the driver-dust collecting mechanism 21 via an air tube 293.

As illustrated in FIGS. 1 to 3, the suction point 10 of the chip mounter 100 in the first preferred embodiment is surrounded by a wall 62 and an air curtain 231. It is noted that the air curtain 231 is disposed in front of and behind the suction point 10 with respect to the individual drawing sheets. It is also noted that the foreign-substance removing head 17 may spray the gas to the chip component 3 in the outside of a region surrounded by the wall 62 and the air curtain 231; alternatively, the foreign-substance removing head 17 may spray the gas to the chip component 3 within this surrounded region. At this time, the gas, sprayed to the chip component 3 by the foreign-substance removing head 17, is a gas within the region surrounded by the wall 62 and the air curtain 231.

As illustrated in FIGS. 1 to 3, the chip mounter 100 in the first preferred embodiment further includes an air introducing unit 51 and an air exhausting unit 52 as well as the same components as those of the chip mounter 200 in the fundamental technique. The air introducing unit 51 is disposed above the suction point 10, and introduces external air to the suction point 10, which is surrounded by the air curtain 231. The air introducing unit 51 is disposed on a suction section ceiling 61 of the suction section 103 of the chip mounter 100. Disposed on the suction section ceiling 61 is a filter 241. The external air as purified through the filter 241 is introduced to the suction point 10 below the suction section ceiling 61. The air exhausting unit 52 is disposed below the suction point 10, and exhausts the air within the region, surrounded by the air curtain 231, to the outside of the chip mounter 100 through, for instance, a duct.

As illustrated in FIG. 1 to 3, the air curtain 231 and an air curtain 232 are disposed between the suction point 10, at which the chip component 3 is sucked, and the mount point, at which the chip component 3 is mounted on the substrate 8. In other words, the chip component 3, sucked by the sucking-and-mounting arm 6, passes through the air curtains 231 and 232 when the sucking-and-mounting arm 6 moves from the suction point 10 through the inspection section 104 to the mount point 15.

As illustrated in FIG. 3, the mount point 15 is surrounded by the air curtain 232 and an air curtain 233. It is noted that these air curtains are disposed in front of and behind the mount point 15 with respect to the drawing sheet of FIG. 3. A filter 242 is disposed on a mount section ceiling 63 of the mount section 105. External air as purified through the filter 242 is introduced to the mount point 15.

Figure 9:
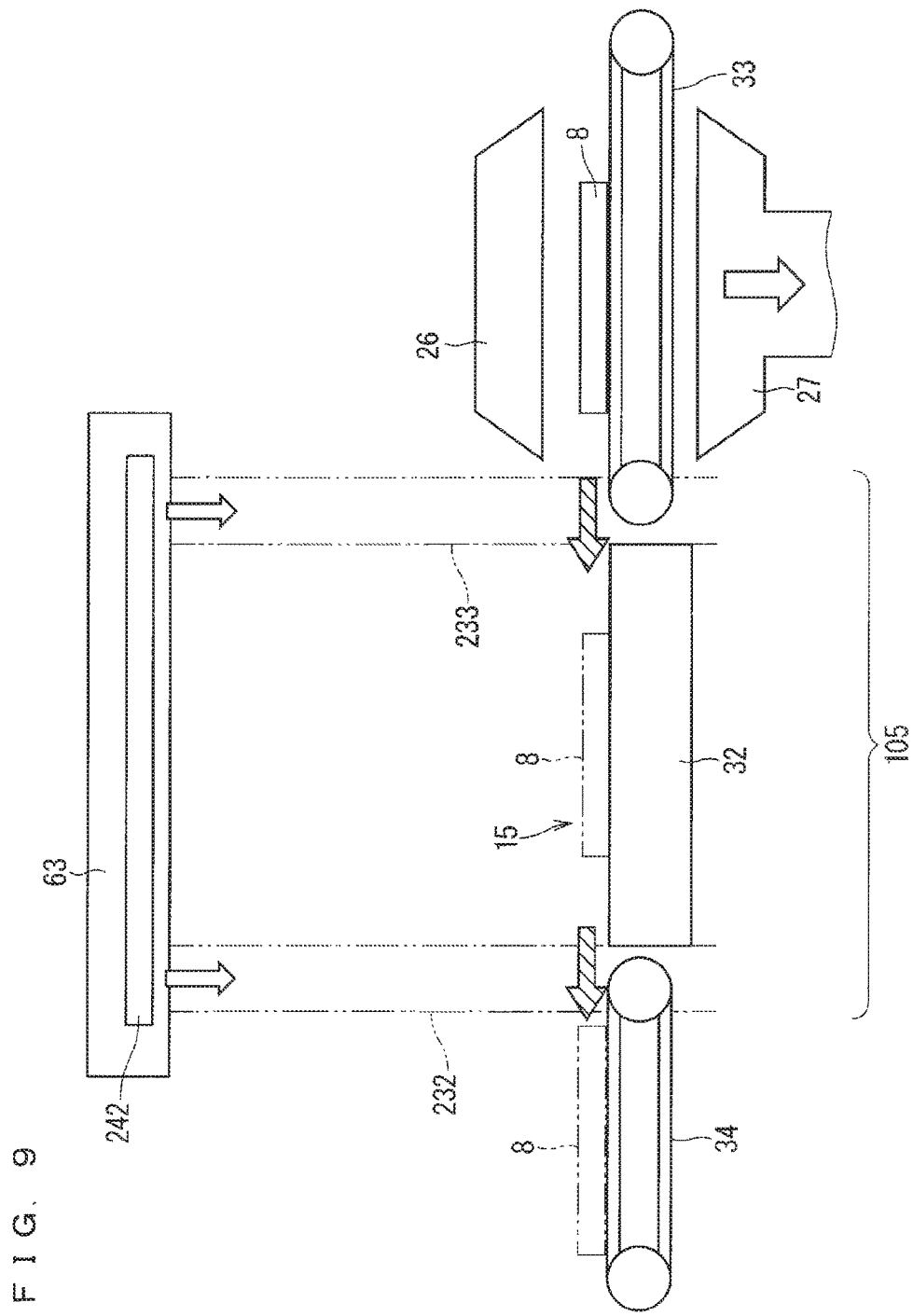
FIG. 9 is a schematic view of a configuration of a mount section of the chip mounter according to the first preferred embodiment.

FIG. 9 is a schematic view of a configuration of the mount section 105 of the chip mounter 100. Disposed in the mount section 105 is an in-loader 33 that moves the substrate 8 onto the mount stage 32. Also disposed in the mount section 105 is an out-loader 34 that moves the substrate 8 outside the chip mounter 100 from the mount stage 32. It is noted that although not shown, means for moving the substrate 8 from the mount stage 32 to the out-loader 34 is provided. This means may also serve as means for moving the substrate 8 from the in-loader 33 to the mount stage 32.

The mount section 105 further includes a spraying mechanism 26 and a dust collecting mechanism 27. The spraying mechanism 26 sprays a gas to the substrate 8 on the in-loader 33. The dust collecting mechanism 27 takes in the gas as sprayed to the substrate 8 on the in-loader 33.

Figure 10:
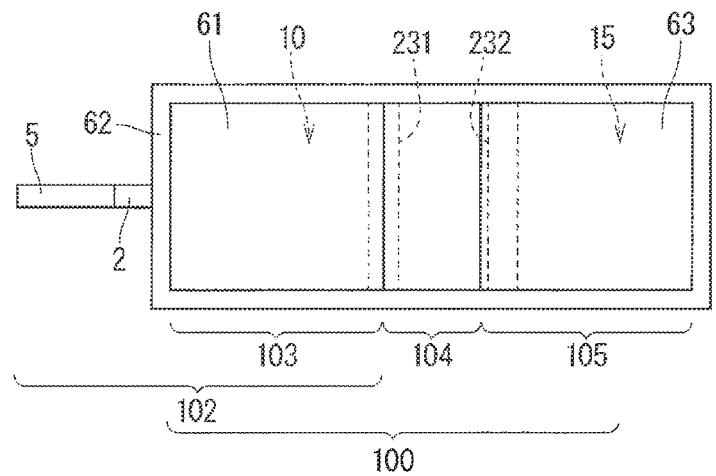
FIG. 10 is a top view of the chip mounter according to the first preferred embodiment.

FIG. 10 is a top view of the chip mounter 100. The air curtains are disposed around the suction section 103 and the mount section 105. In some embodiments, the wall 62 may be disposed all around the suction section 103, the inspection section 104, and the mount section 105, as illustrated in FIG. 10. It is noted that in FIG. 10, the air curtains 231 and 232 are disposed between the suction section 103 and the mount section 105.

Second Preferred Embodiment

A chip mounter according to the second preferred embodiment further includes a cavity cleaning mechanism 13, described in the first preferred embodiment, as well as the same components as those of the chip mounter 200 in the fundamental technique. The chip mounter in the second preferred embodiment also includes the top tape guide 16, which is described in the first preferred embodiment. The chip mounter 100 in the first preferred embodiment includes mechanisms other than the cavity cleaning mechanism 13 and the top tape guide 16. The chip mounter in the second preferred embodiment is generally configured in the same manner as the chip mounter in the fundamental technique except for the cavity cleaning mechanism 13 and the top tape guide 16.

The chip mounter in the second preferred embodiment is configured to take out a chip component 3 accommodated in a packing tape 2, and mount the chip component 3 onto a substrate 8. The packing tape 2 includes the following: a carrier tape 1 having a plurality of pockets 11 individually accommodating a plurality of the chip components 3; and a cover tape 4 covering the individual openings of the plurality of pockets 11. The plurality of pockets 11 each have a bottom surface provided with a through hole 12. The chip mounter includes the following: a tape travelling rail 9 on which the packing tape 2 fed to a suction point 10 travels; a sucking-and-mounting arm 6 configured to, at the suction point 10, take out the chip component 3 from the pocket 11 of the carrier tape 1 with the cover tape 4 detached therefrom by sucking the chip component 3; and a cavity cleaning mechanism 13. The cavity cleaning mechanism 13 includes suction holes 14 each disposed upstream of the suction point 10, in a location of the tape travelling rail 9, on which the carrier tape 1 with the cover tape 4 attached thereto travels so as to overlap the through hole 12. The cavity cleaning mechanism 13 is configured to take in the inside of the pocket 11 through the suction hole 14 and the through hole 12.

The cavity cleaning mechanism 13 enables the removal of foreign substances adhering to the chip components 3 accommodated in the packing tape 2 and the removal of foreign substances existing in the pockets 11 of the carrier tape 1. Herein, examples of the foreign substances include burrs resulting from the cut of the carrier tape 1 and environmental foreign substances entering the pockets 11 during the packing of the carrier tape 1. The foreign substances are prevented from being mounted on the substrate 8 along with the chip components 3. This prevents, for instance, the degradation of the electrical properties of an electronic circuit substrate that is manufactured by the chip mounter.

The chip mounter in the second preferred embodiment further includes the top tape guide 16 provided in such a manner that the packing tape 2 is sandwiched between the top tape guide 16 and the tape travelling rail 9. As described in the first preferred embodiment, the top tape guide 16 is disposed above the through hole 12, and is engaged in the tape travelling rail 9 on the left and right sides of the packing tape 2.

The tape travelling rail 9 is engaged in the top tape guide 16 on the left and right sides of the packing tape 2. This prevents the cavity cleaning mechanism 13 from taking in air entering from a gap between the top tape guide 16 and the tape travelling rail 9. Consequently, the cavity cleaning mechanism 13 takes in more air from the opening adjacent to the suction point 10 through a space between the carrier tape 1 and the cover tape 4, thereby efficiently removing the foreign substances within the packing tape 2.

As described in the first preferred embodiment, the chip mounter in the second preferred embodiment is configured such that the packing tape 2 is fed to the suction point 10 in a unit of the pocket 11 while repeating a movement and a stop. Further, the chip mounter is configured such that the cavity cleaning mechanism 13 takes in the inside of the pocket 11 after the chip component 3 is taken out from the pocket 11 and until the packing tape 2 starts moving.

For continuous intake performed by the cavity cleaning mechanism 13, the carrier tape 1 adheres to the tape travelling rail 9. The carrier tape 1 is thus difficult to move. Further, when the sucking-and-mounting arm 6 sucks the chip component 3, a flow of air entering a space between the carrier tape 1 and the cover tape 4 can cause the chip component 3 to deviate, thereby resulting in a suction failure. To address this problem, the cavity cleaning mechanism 13 takes in the inside of the pocket 11 after the sucking-and-mounting arm chip 6 takes out the chip component 3 from the pocket 11 and until the packing tape 2 starts moving. In other words, the cavity cleaning mechanism 13 fails to take in the inside of the pocket 11 while the packing tape 2 is moving and while the sucking-and-mounting arm 6 is taking out the chip component 3 from the pocket 11. This avoids the aforementioned suction failure.

Third Preferred Embodiment

A chip mounter according to a third preferred embodiment further includes a foreign-substance removing head 17, already described in the first preferred embodiment, as well as the same components as those of the chip mounter 200 in the fundamental technique. The chip mounter 100 in the first preferred embodiment includes other mechanisms in addition to the foreign-substance removing head 17. The chip mounter in the third preferred embodiment is generally configured in the same manner as the chip mounter in the fundamental technique except for the foreign-substance removing head 17.

The chip mounter in the third preferred embodiment is configured to take out a chip component 3 accommodated in a packing tape 2, and mount the chip component 3 onto a substrate 8. The chip mounter includes the following: a tape travelling rail 9 on which the packing tape 2 fed to a suction point 10 travels; a sucking-and-mounting arm 6 configured to, at the suction point 10, take out the chip component 3 from a pocket 11 by sucking the chip component 3; and the foreign-substance removing head 17 configured to spray a gas to the chip component 3, which is taken out from the packing tape 2 by the sucking-and-mounting arm 6.

The gas spray performed by the foreign-substance removing head 17 with the chip component 3 sucked by the sucking-and-mounting arm 6 enables foreign substances adhering between the terminals of the chip components 3 to be removed. The foreign substances are consequently prevented from being mounted on the substrate 8 along with the chip components 3. This prevents, for instance, the degradation of the electrical properties of an electronic circuit substrate that is manufactured by the chip mounter.

As described in the first preferred embodiment, the chip mounter in the third preferred embodiment is configured such that the foreign-substance removing head 17 is attached to the sucking-and-mounting arm 6, and that the suction performed by the sucking-and-mounting arm 6 and the gas spray performed by the foreign-substance removing head 17 are performed, in common, by the intake-and-exhaust mechanism 28, which is attached to the sucking-and-mounting arm 6.

The sucking-and-mounting arm 6 needs to move to the foreign-substance removing head 17 for the gas spray if the foreign-substance removing head 17 is fixed to and disposed on a location separately from the sucking-and-mounting arm 6. In contrast, the foreign-substance removing head 17 in the third preferred embodiment, which is attached to the sucking-and-mounting arm 6, simultaneously sprays the gas while the sucking-and-mounting arm 6 is moving the chip component 3. This enhances the flexibility of a movement path for the sucking-and-mounting arm 6, thereby achieving a less tact time for mounting the chip components 3.

As described in the first preferred embodiment, the chip mounter in the third preferred embodiment is configured such that the sucking-and-mounting arm 6 has a tip provided with the sucking head 7. The chip mounter further includes the inspection section 104 configured to detect a positional deviation of the chip component 3, sucked by the sucking head 7, from the sucking head 7, and to correct the positional deviation when the chip component 3 is mounted on the substrate. In the chip mounter, the foreign-substance removing head 17 is configured to spray the gas to the chip component 3 before the inspection section 104 detects the positional deviation.

When the foreign-substance removing head 17 sprays the gas to the chip component 3, the chip component 3 can move and thus deviate from the sucking head 7. A positional deviation can result from the gas spray performed by the foreign-substance removing head 17 after the inspection section 104 detects the positional deviation. Such a positional deviation is never corrected. Hence, the foreign-substance removing head 17 preferably sprays the gas before the inspection section 104 detects the positional deviation. This enables the inspection section 104 to correct a positional deviation of the chip component 3, if any, due to the gas spray.

Fourth Preferred Embodiment

A chip mounter according to a fourth preferred embodiment further includes a driver-dust collecting mechanism 21, already described in the first preferred embodiment, as well as the same components as those of the chip mounter 200 in the fundamental technique. The chip mounter 100 in the first preferred embodiment includes other mechanisms in addition to the driver-dust collecting mechanism 21. The chip mounter in the fourth preferred embodiment is generally configured in the same manner as the chip mounter in the fundamental technique except for the driver-dust collecting mechanism 21.

The chip mounter in the fourth preferred embodiment is configured to take out a chip component 3 accommodated in a packing tape 2, and mount the chip component 3 onto a substrate 8. The chip mounter includes the following: a tape travelling rail 9 on which the packing tape 2 fed to a suction point 10 travels; a sucking-and-mounting arm 6 configured to, at the suction point 10, take out the chip component 3 from a pocket 11 by sucking the chip component 3; a driver 20 configured to move a body of the sucking-and-mounting arm 6 along a rail 19; and the driver-dust collecting mechanism 21 configured to collect dust generated by friction between the drive mechanism of a driver 20 and the rail 19.

The driver-dust collecting mechanism 21 collects and dusts off foreign substances resulting from friction or abrasion between the rail 19 and the drive mechanism of the driver 20 during the movement of the driver 20 along the rail 19. This prevents the mount portion 105 from being contaminated and prevents the foreign substances from adhering to the substrate 8. The foreign substances are consequently prevented from being mounted on the substrate 8 along with the chip components 3. This prevents, for instance, the degradation of the electrical properties of an electronic circuit substrate that is manufactured by the chip mounter.

As described in the first preferred embodiment, the chip mounter in the preferred fourth embodiment is configured such that the suction performed by the sucking-and-mounting arm 6 and the intake performed by the driver-dust collecting mechanism 21 are performed by the common intake-and-exhaust mechanism 28 in common.

The suction performed by the sucking-and-mounting arm 6 and the intake performed by the driver-dust collecting mechanism 21 are performed by the intake-and-exhaust mechanism 28. This eliminates the need for an additional intake mechanism for the driver-dust collecting mechanism 21. This achieves a simply structured chip mounter including fewer components. In addition, this also prevents an increase in mass of the sucking-and-mounting arm 6, which is driven by the driver 20.

Fifth Preferred Embodiment

A chip mounter according to a fifth preferred embodiment further includes a foreign-substance removing head 17, already described in the first preferred embodiment, as well as the same components as those of the chip mounter 200 in the fundamental technique. As described in the first preferred embodiment, the chip mounter in the fifth preferred embodiment is configured such that the wall 62 and the air curtains 231 surrounds the suction point 10, and that the air curtains 232 and 233 surrounds the mount section 15. Further, as described in the first preferred embodiment, the chip mounter in the fifth preferred embodiment includes an air introducing unit 51 disposed above a suction point 10, an air exhausting unit 52 disposed below the suction point 10, and a mount-section ceiling 63 disposed above a mount section 15. The chip mounter in the first preferred embodiment includes other mechanisms in addition to the following list: the foreign-substance removing head 17, the wall 62, the air curtain 231, the air introducing unit 51, and the air exhausting unit 52. The chip mounter in the fifth preferred embodiment is generally configured in the same manner as the chip mounter in the fundamental technique except for the aforementioned list.

The chip mounter in the fifth preferred embodiment is configured to take out a chip component 3 accommodated in a packing tape 2, and mount the chip component 3 onto a substrate 8. The chip mounter includes the following: a tape travelling rail 9 on which the packing tape 2 fed to the suction point 10 travels, and a foreign-substance removing head 17 configured to spray a gas to the chip component 3, which is taken out from the packing tape 2 by the sucking-and-mounting arm 6. Further, the chip mounter is configured such that the suction point 10 is surrounded by a wall 62 and an air curtain 231, and that the gas, which is sprayed to the chip component 3 by the foreign-substance removing head 17, is a gas accommodated in the air curtain 231.

The wall 62 and the air curtain 231 surrounds the suction point 10. This enables the suction point 10 to be shut off from external air, thereby preventing external foreign substrates from adhering to the chip components 3. Further, the foreign-substance removing head 17 sprays air that is shut off from the external air to the chip components. This enables foreign substrates adhering to the chip components 3 as well to be removed. The foreign substances are consequently prevented from being mounted on the substrate 8 along with the chip components 3. This prevents, for instance, the degradation of the electrical properties of an electronic circuit substrate that is manufactured by the chip mounter.

As described in the first preferred embodiment, the chip mounter in the fifth preferred embodiment further includes the following: the air introducing unit 51 disposed above the suction point 10, and configured to introduce external air to the suction point 10 surrounded by the air curtain 231; and the air exhausting unit 52 disposed below the suction point 10, and configured to exhaust a gas within a region surrounded by the air curtain 231.

The wall 62 and the air curtain 231 surround the suction point 10. Further, the external air as purified is introduced from above the suction point 10. Still further, the gas is exhausted from below the suction point 10. Consequently, a current of air is produced around the suction point 10. This enables foreign substances around the suction point 10 to be exhausted outside the chip mounter, thereby preventing foreign substances adhering to the components, such as sucking-and-mounting arm 6 and the driver 20 from being transferred to the mount section 15.

As described in the first preferred embodiment, the chip mounter in the fifth preferred embodiment is configured such that a filter 241 is disposed in the air introducing unit 51, and that the external air is introduced to the suction point 10 through the filter 241 of the air introducing unit 51.

The air curtain 231 receives the external air as purified through the filter 241. The foreign-substance removing head 17 consequently sprays the purified air to the chip component 3. This eliminates the need for an air purifying mechanism for the foreign-substance removing head 17, thereby achieving a simple chip mounter and prevents an increase in facility cost. Further, the chip mounter in the fifth preferred embodiment can include a cavity cleaning mechanism 13, which is described in the first preferred embodiment. In this case, the inside of the pocket 11 is taken in with the air as purified through the filter 241. As a result, the foreign substrates within the pocket 11 are effectively removed.

As described in the first preferred embodiment, the chip mounter in the fifth preferred embodiment is configured such that the air curtain 231 and an air curtain 232 are disposed between the suction point 10 and the mount point 15, at which the chip component 3 is mounted, and that the sucking-and-mounting arm 6 having the sucked chip component 3 passes through the air curtains 231 and 232.

The air curtain 232 is disposed in a surface perpendicular to a movement path for the sucking-and-mounting arm 6, between the suction point 10 and the mount point 15. This prevents the foreign substances adhering to the sucking-and-mounting arm 6 from being transferring between the suction point 10 and the mount point 15. In some embodiments, the air curtain 231 is disposed in the surface perpendicular to the movement path for the sucking-and-mounting arm 6.

Sixth Preferred Embodiment

A chip mounter according to a sixth preferred embodiment includes the same components as those of the chip mounter 200 in the fundamental technique, and is configured such that air curtains 232 and 233 surround a mount point 15, at which a chip component 3 is mounted on a substrate 8. The chip mounter 100 in the first preferred embodiment includes other mechanisms in addition to the mount point 15 surrounded by the air curtains 232 and 233. The chip mounter in the sixth preferred embodiment is generally configured in the same manner as the chip mounter in the fundamental technique except for the mount point 15 surrounded by the air curtains 232 and 233.

The chip mounter in the sixth preferred embodiment is configured to take out the chip component 3 accommodated in a packing tape 2, and mount the chip component 3 onto the substrate 8. The chip mounter includes the following: a tape travelling rail 9 on which the packing tape 2 fed to the suction point 10 travels; and a sucking-and-mounting arm 6 configured to, at the suction point 10, take out the chip component 3 from the pocket 11 by sucking the chip component 3. In the chip mounter, the mount point 15, at which the chip component 3 is disposed on the substrate 8, is surrounded by the air curtains 232 and 233.

The curtains 232 and 233 surround the mount point 15. Consequently, foreign substances are prevented from entering a neighborhood of the mount point 15. This enables the mount point 15 to be sufficiently purified. The foreign substances are consequently prevented from being mounted on the substrate 8 along with the chip components 3. This prevents, for instance, the degradation of the electrical properties of an electronic circuit substrate that is manufactured by the chip mounter.

Seventh Preferred Embodiment

A chip mounter according to a seventh preferred embodiment includes the same components as those of the chip mounter 200 in the fundamental technique, and is configured such that a wall 62 surrounds a space containing a suction point 10, at which a chip component 3 is sucked by a sucking-and-mounting arm 6, and a mount point 15, at which the chip component 3 is mounted on a substrate 8, as described with reference to FIG. 10 in the first preferred embodiment. The chip mounter 100 in the first preferred embodiment includes other mechanisms in addition to the configuration in which the space, including the suction point 10 and the mount point 15, is surrounded by the wall 62. The chip mounter in the sixth preferred embodiment is generally configured in the same manner as the chip mounter in the fundamental technique except for this configuration, in which the space the suction point 10 and the mount point 15 is surrounded by the wall 62.

The chip mounter in the seventh preferred embodiment is configured to take out a chip component 3 accommodated in a packing tape 2, and mount the chip component 3 onto a substrate 8. The chip mounter includes the following: a tape travelling rail 9 on which the packing tape 2 fed to the suction point 10 travels; and a sucking-and-mounting arm 6 configured to, at the suction point 10, take out the chip component 3 from the pocket 11 by sucking the chip component 3. In the chip mounter, the wall 62 surrounds the space containing the suction point 10, at which the chip component 3 is sucked by the sucking-and-mounting arm 6, and the mount point 15, at which the chip is mounted on the substrate.

The space containing the suction point 10 and the mount point 15 is surrounded by the wall 62 to constitute a single space. This prevents external foreign substances from entering the suction point 10 and the mount point 15. Further, the suction point 10 and the mount point 15 share an introducing unit introducing external air, and filters 241 and 242, through which the external air is purified. This achieves less facility costs.

Eighth Preferred Embodiment

A chip mounter according to an eighth preferred embodiment further includes an in-loader 33, a spraying mechanism 26, and a dust collecting mechanism 27, all of which are described with reference to in FIG. 9 in the first preferred embodiment, as well as the same components as those of the chip mounter 200 in the fundamental technique. The in-loader 33 moves the substrate 8 to a mount point 15, at which a chip component 3 is mounted on a substrate 8. The spraying mechanism 26 sprays a gas to the substrate 8 on the in-loader 33. The dust collecting mechanism 27 takes in the gas as sprayed to the substrate 8. The chip mounter 100 in the first preferred embodiment includes other mechanisms in addition to the spraying mechanism 26 and the dust collecting mechanism 27. The chip mounter in the eighth preferred embodiment is generally configured in the same manner as the chip mounter in the fundamental technique except for the spraying mechanism 26 and the dust collecting mechanism 27.

The chip mounter in the eighth preferred embodiment is configured to take out the chip component 3 accommodated in a packing tape 2, and mount the chip component 3 onto the substrate 8. The chip mounter includes the following: a tape travelling rail 9 on which the packing tape 2 fed to a suction point 10 travels; a sucking-and-mounting arm 6 configured to, at the suction point 10, take out the chip component 3 from the pocket 11 by sucking the chip component 3; the in-loader 33; the spraying mechanism 26 configured to spray a gas to the substrate 8 on the in-loader 33; and the dust collecting mechanism 27 configured to take in the gas as sprayed to the substrate 8 on the in-loader 33.

The spraying mechanism 26 and the dust collecting mechanism 27 enables foreign substances adhering to the substrate 8 externally transferred by the in-loader 33 to be removed. The foreign substances are consequently prevented from being mounted on the substrate 8 along with the chip components 3. This prevents, for instance, the degradation of the electrical properties of an electronic circuit substrate that is manufactured by the chip mounter.

The chip mounters according to the first to eighth preferred embodiments mounts the chip components 3 onto the substrate 8. Moreover, the substrate 8 with the chip component thereon undergoes heating to melt a joining material disposed on a land of the substrate 8. The land on the substrate 8 is consequently electrically connected to a terminal of the chip component 3. In this way, an electronic circuit substrate is manufactured that prevents a degradation of the electrical properties and thus has high reliability.

An example of this electronic circuit substrate is an electronic circuit substrate for driving switching elements. The switching elements are used for, for instance, power conversion, and are power semiconductors containing SiC or GaN. Examples of the switching elements include insulated gate bipolar transistors (IGBTs) and metal-oxide-semiconductor field-effect transistors (MOSFETs). As described above, the electronic circuit substrate manufactured by the chip mounters according to the first to eighth preferred embodiments, in combination with the switching elements, achieves a power module that prevents a degradation of the electrical properties and thus has high reliability.

It is noted that the components added to the chip mounter in the fundamental technique in the individual second to eighth preferred embodiments can be freely combined. It is also noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A chip mounter configured to take out a chip component accommodated in a packing tape and mount the chip component onto a substrate,
    the packing tape comprising
        a carrier tape comprising a plurality of pockets individually accommodating a plurality of the chip components, and
        a cover tape covering individual openings of the plurality of pockets,
        the plurality of pockets each comprising a bottom surface comprising a through hole,
    the chip mounter comprising:
    a tape travelling rail on which the packing tape to be fed to a suction point travels;
    a sucking-and-mounting arm configured to, at the suction point, take out the chip component from the pocket of the carrier tape with the cover tape detached therefrom by sucking the chip component; and
    a cavity cleaning mechanism,
    wherein the cavity cleaning mechanism comprises an intake hole disposed upstream of the suction point, in a location of the tape travelling rail, on which the carrier tape with the cover tape attached thereto travels so as to overlap the through hole, and
    wherein the cavity cleaning mechanism is configured to take in an inside of the pocket through the intake hole and the through hole.

2. The chip mounter according to claim 1, further comprising
    a top tape guide provided in such a manner that the packing tape is sandwiched between the top tape guide and the tape travelling rail,
    wherein the top tape guide is disposed above the through hole of the tape travelling rail, and
    wherein the top tape guide is engaged in the tape travelling rail on left and right sides of the packing tape.

3. The chip mounter according to claim 1,
    wherein the packing tape is fed to the suction point in a unit of the pocket while repeating a movement and a stop, and
    wherein the cavity cleaning mechanism is configured to take in the inside of the pocket after the packing tape stops moving and the sucking-and-mounting arm takes out the chip component from the pocket, and until the packing tape starts moving.

4. An electronic circuit substrate comprising the chip component mounted on the substrate by the chip mounter according to claim 1.

5. A power module comprising:
    the electronic circuit substrate according to claim 4; and
    a switching element driven by the electronic circuit substrate.

6. A chip mounter configured to take out a chip component accommodated in a packing tape and mount the chip component onto a substrate, the chip mounter comprising:
    a tape travelling rail on which the packing tape to be fed to a suction point travels;
    a sucking-and-mounting arm configured to, at the suction point, take out the chip component from the packing tape by sucking the chip component; and
    a foreign-substance removing head configured to spray a gas to the chip component, which is taken out from the packing tape and sucked by the sucking-and-mounting arm.

7. The chip mounter according to claim 6, wherein
    the foreign-substance removing head is attached to the sucking-and-mounting arm, and
    wherein the suction performed by the sucking-and-mounting arm and the gas spray performed by the foreign-substance removing head are, in common, performed by an intake-and-exhaust mechanism attached to the sucking-and-mounting arm.

8. The chip mounter according to claim 6,
    wherein the sucking-and-mounting arm comprises a tip comprising a sucking head,
    wherein the chip mounter further comprises an inspection section configured to detect a positional deviation of the chip component sucked by the sucking head from the sucking head, and to correct the positional deviation when the chip component is mounted on the substrate, and
    wherein the gas spray to the chip component performed by the foreign-substance removing head is performed before the inspection section detects the positional deviation.

9. An electronic circuit substrate comprising the chip component mounted on the substrate by the chip mounter according to claim 6.

10. A power module comprising:
    the electronic circuit substrate according to claim 9; and
    a switching element driven by the electronic circuit substrate.

11. A chip mounter configured to take out a chip component accommodated in a packing tape and mount the chip component onto a substrate, the chip mounter comprising:
    a tape travelling rail on which the packing tape to be fed to a suction point travels;
    a sucking-and-mounting arm configured to, at the suction point, take out the chip component from the packing tape by sucking the chip component;

a driver configured to move a body of the sucking-and-mounting arm along a rail; and a driver-dust collecting mechanism configured to collect dust generated by friction between a drive mechanism of the driver and the rail.

12. The chip mounter according to claim 11, wherein the suction performed by the sucking-and-mounting arm and intake performed by the driver-dust collecting mechanism are performed, in common, by an intake-and-exhaust mechanism.

13. An electronic circuit substrate comprising the chip component mounted on the substrate by the chip mounter according to claim 11.

14. A power module comprising:
the electronic circuit substrate according to claim 13; and
a switching element driven by the electronic circuit substrate.

15. A chip mounter configured to take out a chip component accommodated in a packing tape and mount the chip component onto a substrate, the chip mounter comprising:
a tape travelling rail on which the packing tape to be fed to a suction point travels;
a sucking-and-mounting arm configured to, at the suction point, take out the chip component from the packing tape by sucking the chip component; and
a foreign-substance removing head configured to spray a gas to the chip component, which is taken out from the packing tape by the sucking-and-mounting arm,
wherein the suction point is surrounded by a wall and an air curtain, and
wherein the gas sprayed to the chip component by the foreign-substance removing head is a gas within the air curtain.

16. The chip mounter according to claim 15, further comprising:
an introducing unit disposed above the suction point and configured to introduce external air to the suction point, which is surrounded by the air curtain; and
an exhausting unit disposed below the suction point and configured to exhaust a gas in a region surrounded by the air curtain.

17. The chip mounter according to claim 16,
wherein the introducing unit comprises a filter, and
wherein the external air is introduced to the suction point through the filter of the introducing unit.

18. The chip mounter according to claim 15,
wherein an air curtain is disposed between the suction point and a mount point at which the chip component is mounted on the substrate, and
wherein the sucking-and-mounting arm, which has sucked the chip component, passes through the air curtain.

19. An electronic circuit substrate comprising the chip component mounted on the substrate by the chip mounter according to claim 15.

20. A power module comprising:
the electronic circuit substrate according to claim 19; and
a switching element driven by the electronic circuit substrate.

21. A chip mounter configured to take out a chip component accommodated in a packing tape and mount the chip component onto a substrate, the chip mounter comprising:
a tape travelling rail on which the packing tape to be fed to a suction point travels; and
a sucking-and-mounting arm configured to, at the suction point, take out the chip component from the packing tape by sucking the chip component,
wherein a mount point at which the chip component is mounted on the substrate is surrounded by an air curtain.

22. An electronic circuit substrate comprising the chip component mounted on the substrate by the chip mounter according to claim 21.

23. A power module comprising:
the electronic circuit substrate according to claim 22; and
a switching element driven by the electronic circuit substrate.

24. A chip mounter configured to take out a chip component accommodated in a packing tape and mount the chip component onto a substrate, the chip mounter comprising:
a tape travelling rail on which the packing tape to be fed to a suction point travels; and
a sucking-and-mounting arm configured to, at the suction point, take out the chip component from the packing tape by sucking the chip component,
wherein a wall surrounds a space containing the suction point, at which the chip component is sucked by the sucking-and-mounting arm, and a mount point at which the chip component is mounted on the substrate.

25. An electronic circuit substrate comprising the chip component mounted on the substrate by the chip mounter according to claim 24.

26. A power module comprising:
the electronic circuit substrate according to claim 25; and
a switching element driven by the electronic circuit substrate.

27. A chip mounter configured to take out a chip component accommodated in a packing tape and mount the chip component onto a substrate, the chip mounter comprising:
a tape travelling rail on which the packing tape to be fed to a suction point travels;
a sucking-and-mounting arm configured to, at the suction point, take out the chip component from the packing tape by sucking the chip component;
an in-loader configured to move the substrate to a mount point at which the chip component is mounted on the substrate;
a spraying mechanism configured to spray a gas to the substrate on the in-loader; and
a dust collecting mechanism configured to take in the gas as sprayed to the substrate on the in-loader.

28. An electronic circuit substrate comprising the chip component mounted on the substrate by the chip mounter according to claim 27.

29. A power module comprising:
the electronic circuit substrate according to claim 28; and
a switching element driven by the electronic circuit substrate.

* * * * *